US005500788A

United States Patent [19]

Longueville et al.

[11] Patent Number: 5,500,788

[45] Date of Patent: Mar. 19, 1996

[54] PRINTED CIRCUIT BOARD PLUG CONNECTOR WITH TWO SHIELDED CONTACT BANKS DISPOSED ON MUTUALLY PERPENDICULAR PRINTED CIRCUIT BOARDS

[75] Inventors: Jacques Longueville, Oostkamp; Johan Vanbesien, Izegem, both of Belgium

[73] Assignee: Siemens Aktiengesellschaft, Munich, Germany

[21] Appl. No.: 286,938

[22] Filed: Aug. 8, 1994

[30] Foreign Application Priority Data

Aug. 6, 1993 [DE] Germany .......................... 93 11 782.5

[51] Int. Cl.[6] .................................................... H05K 7/14

[52] U.S. Cl. .......................... 361/800; 361/816; 361/818; 361/796; 439/108; 439/109

[58] Field of Search .................................... 361/800, 801, 361/802, 816, 818, 796, 799; 439/567, 607, 609, 79, 62, 80–83, 108, 109, 60, 59, 61, 608, 610

[56] References Cited

U.S. PATENT DOCUMENTS

| | | | |
|---|---|---|---|
| 4,655,518 | 4/1987 | Johnson et al. | 339/17 LC |
| 4,808,115 | 2/1989 | Norton et al. | 439/79 |
| 4,909,743 | 3/1990 | Johnson et al. | 439/60 |
| 4,959,024 | 9/1990 | Czeschka . | |
| 5,192,228 | 3/1993 | Collins et al. | 439/567 |
| 5,307,242 | 4/1994 | Seibold et al. | 361/816 |

FOREIGN PATENT DOCUMENTS

| | | |
|---|---|---|
| 3834182 | 4/1990 | Germany . |

*Primary Examiner*—Leo P. Picard
*Assistant Examiner*—Y. Whang
*Attorney, Agent, or Firm*—Herbert L. Lerner; Laurence A. Greenberg

[57] ABSTRACT

A printed circuit board plug connector includes first and second mutually perpendicular printed circuit boards. A first contact bank in the form of a multiple plug is disposed on the first board and a second contact bank in the form of a multiple connector is disposed in an edge region and protrudes at a longitudinal edge of the second board. The second contact bank has a plug-in area and a body with a lower surface and electrical connections protruding from a lower surface of the second board. A metal shielding element which is a rigid, rectangular, closed circumferential frame surrounds the sides of the first contact bank. The frame has longitudinal walls and transverse walls with inner surfaces. Circumferential metal sheets being feathered at narrow intervals are attached to inner surfaces of the walls of the frame in the form of inwardly curved, resilient, inner contact elements. Insert pins plug the metal shielding element into bores formed in the first board. Two metal shielding shells enclose the second contact bank, and insert pins plug the shielding shells into bores formed in opposite sides of the second board. One of the shielding shells completely encloses the second contact bank on the upper surface of the second board except for the plug-in area and the other shielding shell is attached to the lower surface of the second board and covers the lower surface of the second contact bank body including the electrical connections.

10 Claims, 3 Drawing Sheets

PRINTED CIRCUIT BOARD PLUG CONNECTOR WITH TWO SHIELDED CONTACT BANKS DISPOSED ON MUTUALLY PERPENDICULAR PRINTED CIRCUIT BOARDS

BACKGROUND OF THE INVENTION

FIELD OF THE INVENTION

The invention relates to a printed circuit board plug connector with a first contact bank, e.g. a multiple plug, disposed on a first printed circuit board and a second contact bank, e.g. a multiple connector, disposed in a second printed circuit board being perpendicular to the first printed circuit board, wherein:

a) the sides of the first contact bank are enclosed by a metal shielding element with pins being plugged into bores in the first printed circuit board;

b) the shielding element is constructed with resilient contact elements being curved inward;

c) the second contact bank is placed into an edge region of the second printed circuit board, protrudes at a longitudinal edge of the printed circuit board, and is enclosed by two metal shielding shells being plugged into bores of the second printed circuit board; and d) one shielding shell completely encloses the second contact bank at the upper surface or top of the second printed circuit board, with the exception of the plug-in area.

Such a plug connector is known from German Published, Non-Prosecuted Application DE 38 34 182 A1.

Inadmissible emissions occur, among others reasons, due to an increase of the transmission rate of digital signals with conventional LF plug connectors. In order to prevent that kind of emissions or the penetration of interference signals, the plug connector parts need to be suitably shielded. With conventional LF plug connectors having a multiple plug and a multiple connector disposed on printed circuit boards being perpendicular to one another, the shielding of the plug connector parts is not always fully effective all around, i.e. sufficient shielding cannot be achieved.

SUMMARY OF THE INVENTION

It is accordingly an object of the invention to provide a printed circuit board plug connector with two shielded contact banks disposed on mutually perpendicular printed circuit boards, which overcomes the hereinafore-mentioned disadvantages of the heretofore-known devices of this general type and which further improves the shielding for such a printed circuit board plug connector.

With the foregoing and other objects in view there is provided, in accordance with the invention, a printed circuit board plug connector, comprising:

a) first printed circuit board, and a second printed circuit board being perpendicular to the first printed circuit board and having opposite sides with upper and lower surfaces and an edge region with a longitudinal edge;

b) a first contact bank such as a multiple plug being disposed on the first printed circuit board and having sides, and a second contact bank such as a multiple connector being disposed in the edge region and protruding at the longitudinal edge of the second printed circuit board, the second contact bank having a plug-in area and having a body with a lower surface and electrical connections protruding from the lower surface of the second printed circuit board;

c) a metal shielding element being a rigid, rectangular, closed circumferential frame surrounding the sides of the first contact bank, the frame having longitudinal walls and transverse walls with inner surfaces, and circumferential metal sheets being feathered at narrow intervals and attached to the inner surfaces of the walls of the frame in the form of inwardly curved, resilient, inner contact elements;

d) insert pins plugging the metal shielding element into bores formed in the first printed circuit board for attaching the metal shielding element to the first printed circuit board;

e) two metal shielding shells enclosing the second contact bank, and insert pins plugging the shielding shells into bores formed in the second printed circuit board for attaching the shielding shells to the opposite sides of the second printed circuit board;

f) one of the shielding shells completely enclosing the second contact bank on the upper surface of the second printed circuit board except for the plug-in area; and g) the other of the shielding shells being attached to the lower surface of the second printed circuit board and covering the lower surface of the second contact bank body including the electrical connections.

With a printed circuit board plug connector of this kind, an effective and secure contact is obtained between the plug connector parts by means of the frame-type shielding element of the first contact bank in conjunction with the interior and exterior contact elements. When connected, a circumferential contact surface is formed and a small, but large-area gap arises between the two plug connector parts. Based on its chimney effect, the gap ensures very good shielding, i.e. shielding to a degree of approximately 60 to 80 dB is obtained in association with the completely closed 360° circumferential shielding of not only the first but also the second contact bank. Furthermore, the entire shielding is of simple construction and can be easily and securely attached to the two printed circuit boards by means of plug-in technology.

In accordance with another feature of the invention, the insert pins plug the shielding shells into the same bores at the upper and lower surfaces of the second printed circuit board.

In accordance with a further feature of the invention, the shielding shells are formed of two bent sheet metal pieces.

In accordance with an added feature of the invention, the shielding shells have a region to be plugged into the frame of the first contact bank, and a precious metal coating in the region to be plugged into the frame.

In accordance with an additional feature of the invention, the shielding shells are hinged laterally to the second contact bank near the plug-in area.

In accordance with yet another feature of the invention, the frame of the first contact bank is formed of a bent sheet metal piece.

In accordance with yet a further feature of the invention, the frame of the first contact bank has corner regions, and the longitudinal walls and the transverse walls of the frame are formed of individual sheet metal pieces being connected in the corner regions.

In accordance with yet an added feature of the invention, the feathered sheet metal pieces of the frame are formed of individual parts being connected to the longitudinal walls and the transverse walls of the frame near the first printed circuit board, by spot welding.

In accordance with a concomitant feature of the invention, the longitudinal walls and the transverse walls of the frame have end surfaces facing the second contact bank, and individual, resilient guide lugs disposed on the end surfaces.

Other features which are considered as characteristic for the invention are set forth in the appended claims.

Although the invention is illustrated and described herein as embodied in a printed circuit board plug connector with two shielded contact banks disposed on mutually perpendicular printed circuit boards, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
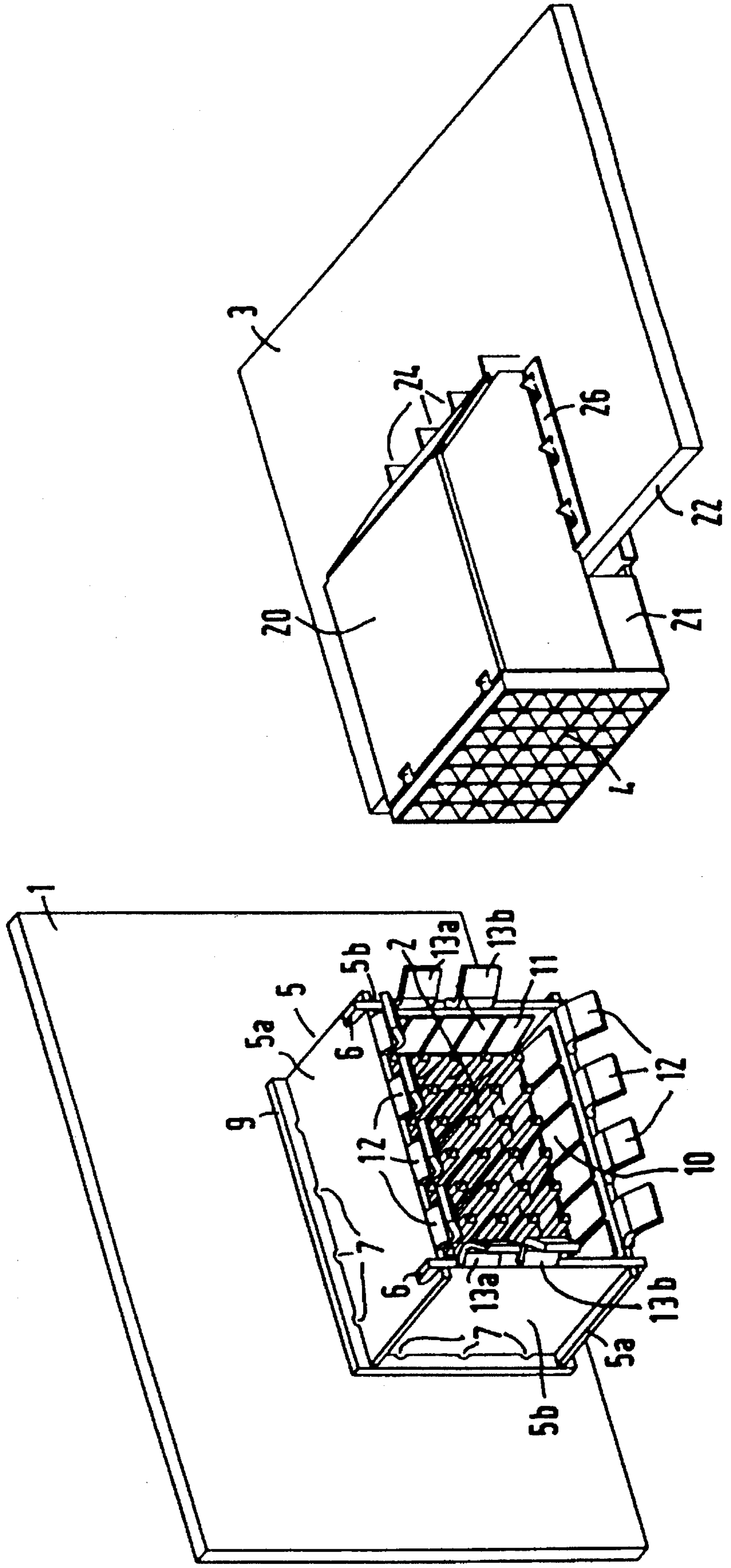
FIG. 1 is a diagrammatic, perspective view of two plug connector parts of a printed circuit board plug connector before being plugged together.
Figure 2:
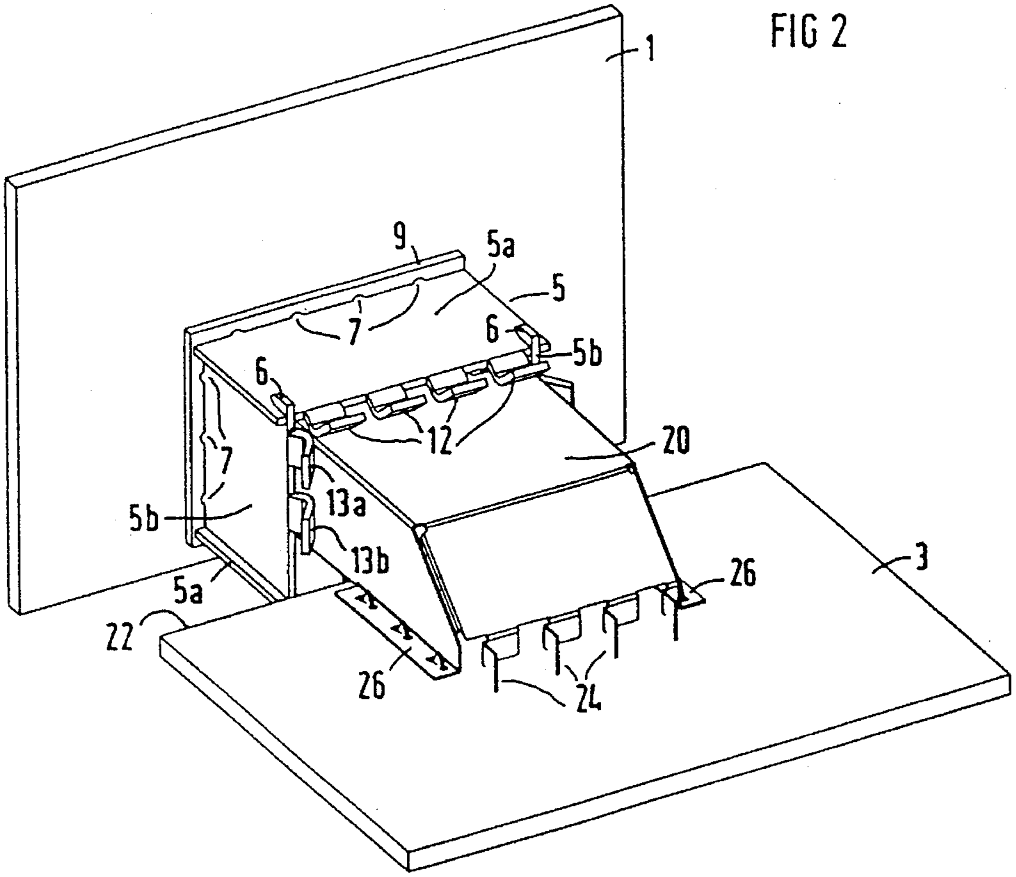
FIG. 2 is a perspective view of the printed circuit board plug connector in plugged-together condition of the two plug connector parts.
Figure 3:
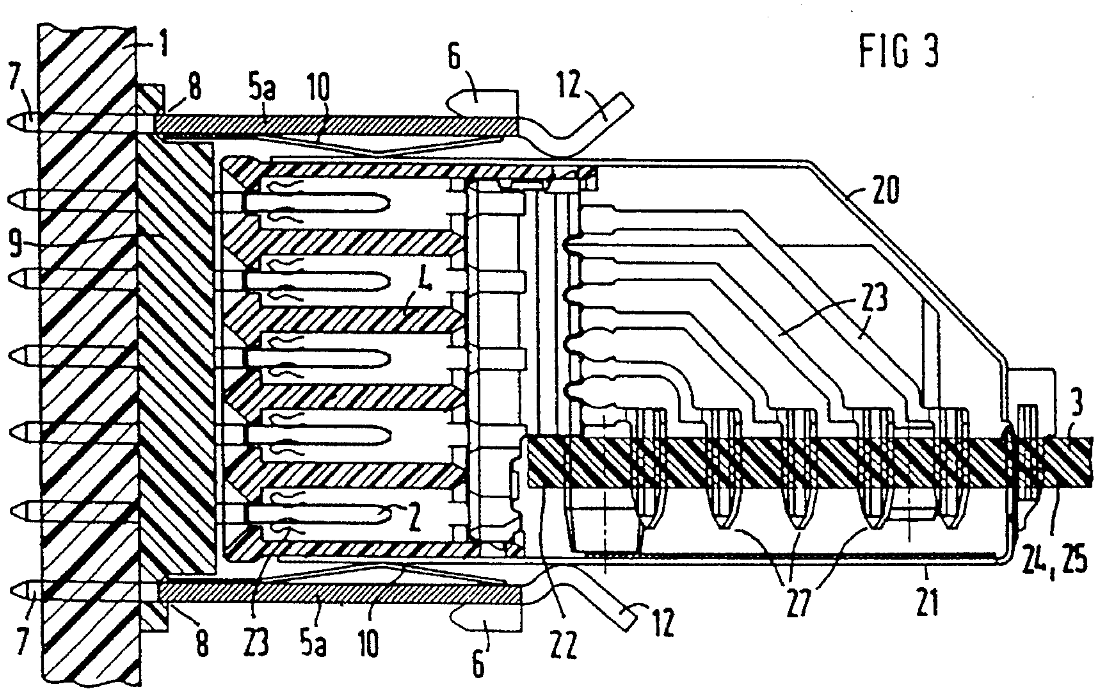
FIG. 3 is a fragmentary, longitudinal-sectional view of the printed circuit board plug connector in plugged-together condition of the two plug connector parts.
Figure 4:
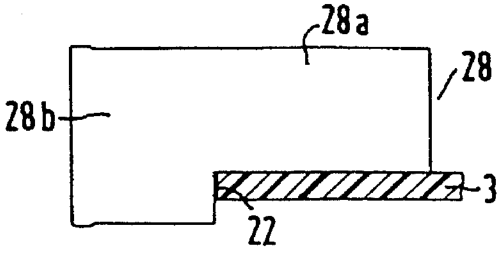
FIGS. 4–8 are elevational views of mountings of an angled plug connector part on a printed circuit board.
Figure 7:
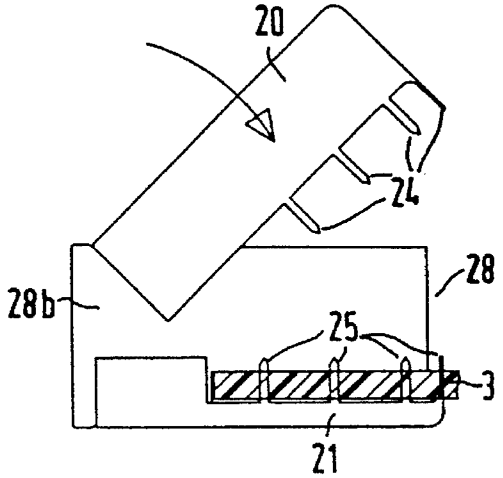
Figure 5:
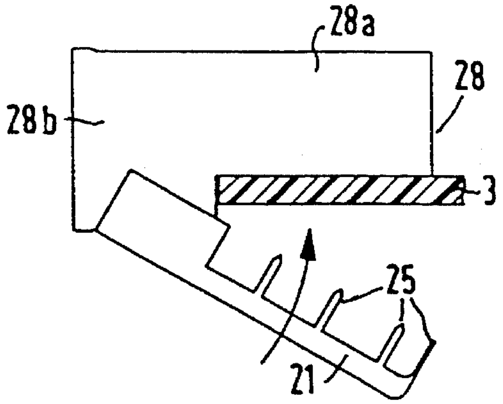

Referring now to the figures of the drawing in detail and first, particularly, to FIGS. 1–3 thereof, there is seen a plug connector according to the invention which serves as a plug connection of two shielded contact banks located on two printed circuit boards that are disposed perpendicular to one another. A first contact bank, e.g. a multiple or multipoint plug 2, is disposed on a first printed circuit board 1, and a second contact bank, e.g. a multiple or socket connector 4, is disposed on a second printed circuit board 3, while each of the contact banks is equipped with a circumferential shielding except for a plug-in area. The sides of the multiple plug 2 of the straight plug connector part are enclosed by a metal shielding element 5 which is constructed as a rigid, rectangular, closed circumferential frame. The frame is formed either of a bent sheet metal piece or of longitudinal walls 5*a* and transverse walls 5*b* which are made of individual sheet metal pieces that are connected in corner areas of the frame, as in the illustrated embodiment. For example, the transverse walls 5*b* may be hung onto the longitudinal walls 5*a* by means of lateral hooks 6. In each case, the frame is plugged into bores in the first printed circuit board 1 and is thus attached to the same by means of insert pins or plug-in studs 7 to be provided on the longitudinal walls 5*a* and the transverse walls 5*b* on the printed circuit board side. If necessary, this involves the insertion of an intermediate plate 9 provided with circumferential slots 8 on the frame side. Naturally, the sheets need not be formed of metal.

Furthermore, the shielding element 5 is constructed with resilient contact elements 10, 11 which are curved inward. In that regard, the interiors of the longitudinal walls 5*a* and the transverse walls 5*b* are equipped with circumferential sheet metal pieces which are attached, for example, by spot welding and are feathered at narrow intervals, close to the first printed circuit board 1, to form the contact elements 10, 11. The contact elements 10, 11 may, for example, be constructed as individual sheet metal pieces 10 attached to the longitudinal walls 5*a* and as individual sheet metal pieces 11 attached to the transverse walls 5*b*. In addition, the longitudinal walls 5*a* and the transverse walls 5*b* of the frame 5 are equipped with individual resilient guide lugs 12 and 13*a*, 13*b*, forming a guide funnel on an end surface facing the second contact bank 4. Four exterior guide lugs 12 are provided on the longitudinal walls 5*a* of the frame and two exterior guide lugs 13*a* and 13*b* are provided on the two transverse walls 5*b* of the frame. In this case, the two last-mentioned exterior guide lugs 13*a* and 13*b* are disposed in such a way that when the two plug connector parts are connected, both guide lugs are located above the level of the second printed circuit board 3.

The second contact bank, i.e. in this case the multiple connector 4 of the angled plug connector part, is placed in an edge region of the second printed circuit board 3, it protrudes at a longitudinal edge 22 of the printed circuit board 3 and it is enclosed by two metal shielding elements, i.e. an upper shielding shell 20 and a lower shielding shell 21. The upper shielding shell 20 is constructed in such a way that it completely encloses the multiple connector 4 on the upper surface or top of the second printed circuit board 3 with the exception of the plug-in area, while the shielding shell 21 located at the lower surface or bottom of the second printed circuit board is constructed in such a way that it covers a lower surface or bottom of a bank body 28 of the multiple connector 4 seen in FIGS. 4–8, including electrical connections of the contact elements 23 protruding from the lower surface or bottom of the second printed circuit board 3. The shielding shells 20, 21 which are formed, for example, of bent sheet metal pieces and have an approximately U-shaped cross section, are plugged into bores formed in the second printed circuit board 3. The shielding shells 20, 21 are attached from opposite sides of the printed circuit board 3 by means of insert pins or plug-in studs 24 and 25 to be provided on edges facing the printed circuit board side. Furthermore, angled side webs 26 may also be provided for attaching the upper shielding shell 20. The shielding shells 20, 21 may, in addition, be coated with precious metal in the area which is to be plugged into the frame 5 of the multiple plug 2.

Figure 8:
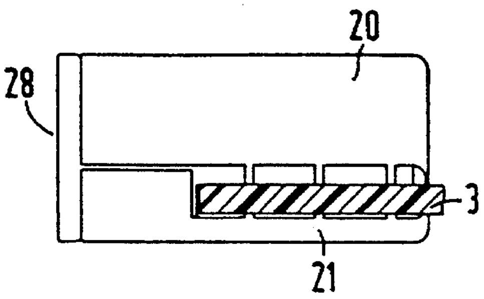
Figure 6:
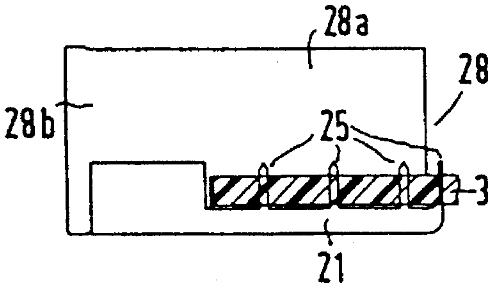

The installation of the angled plug connector part on the second printed circuit board 3 is explained below with reference to FIGS. 4 through 8. Initially, the multiple connector 4 is attached to the printed circuit board 3 (FIG. 4) with its angled contact elements 23 or its insert pins or plug-in studs 27 seen in FIG. 3, without the shielding shells 20, 21. A larger part 28*a* of the bank body 28 is placed on the upper surface or top of the printed circuit board, while its front part 28*b* lies against the longitudinal edge 22 of the printed circuit board and protrudes on the lower surface or bottom of the printed circuit board. Thereafter, the lower shielding shell 21 is hinged onto the front part 28*b* of the contact bank 28 near the plug-in area (FIG. 5), it is then pivoted from underneath the printed circuit board 3 against the same and pushed against the contact bank body 28, until the insert pins or plug-in studs 25 of the shielding shell 21 engage in the bores of the printed circuit board 3 (FIG. 6). Subsequently, the upper shielding shell 20 is also hinged onto the front part 28*b* of the contact bank body 28, it is pivoted from above the printed circuit board 3 against the same (FIG. 7) and it pushed against the contact bank body 28, until the insert pins or plug-in studs 24 of the upper shielding shell 20 are pressed into the same bores (FIG. 8). In this state, the multiple connector 4 is enclosed on all sides by the two shielding shells 20, 21 and is shielded on its entire periphery.

We claim:

1. A printed circuit board plug connector, comprising:

a) a first printed circuit board, and a second printed circuit board perpendicular to said first printed circuit board and having opposite sides with upper and lower surfaces and an edge region with a longitudinal edge;

b) a first contact bank disposed on said first printed circuit board and having sides, and a second contact bank disposed in said edge region and protruding at said longitudinal edge of said second printed circuit board, said second contact bank having a plug-in area and having a body with a lower surface and electrical connections protruding from said lower surface of said second printed circuit board;

c) a metal shielding element attached to said first printed circuit board, said metal shielding element being a rigid, rectangular, circumferentially closed frame shieldingly surrounding said sides of said first contact bank, said frame having longitudinal walls and transverse walls with inner surfaces, and metal sheets being feathered at narrow intervals and attached circumferentially to all of said inner surfaces of said walls of said frame in the form of inwardly curved, resilient, inner contact elements;

d) insert pins plugging said metal shielding element into bores formed in said first printed circuit board for attaching said metal shielding element to said first printed circuit board;

e) two metal shielding shells attached to said second printed circuit board and enclosing said second contact bank, insert pins plugging said shielding shells into bores formed in said second printed circuit board for attaching said shielding shells to said opposite sides of said second printed circuit board;

f) one of said shielding shells completely enclosing said second contact bank on said upper surface of said second printed circuit board except for said plug-in area; and g) the other of said shielding shells being attached to said lower surface of said second printed circuit board and completely covering said lower surface of said second contact bank body including said electrical connections, except for said plug-in area;

h) said metal shielding element together with said two metal shielding shells completely surrounding and shielding the plug connector when said first and second contact banks are plugged together.

2. The printed circuit board plug connector according to claim 1, wherein said first contact bank is a multiple plug and said second contact bank is a multiple connector.

3. The printed circuit board plug connector according to claim 1, wherein said insert pins plug said shielding shells into the same bores at said upper and lower surfaces of the second printed circuit board.

4. The printed circuit board plug connector according to claim 1, wherein said shielding shells are formed of two bent sheet metal pieces.

5. The printed circuit board plug connector according to claim 1, wherein said shielding shells have a region to be plugged into said frame of said first contact bank, and a precious metal coating in said region to be plugged into said frame.

6. The printed circuit board plug connector according to claim 1, wherein said shielding shells are hinged laterally to said second contact bank near said plug-in area.

7. The printed circuit board plug connector according to claim 1, wherein said frame of said first contact bank is formed of a bent sheet metal piece.

8. The printed circuit board plug connector according to claim 1, wherein said said frame of said first contact bank has corner regions, and said longitudinal walls and said transverse walls of said frame are formed of individual sheet metal pieces being connected in said corner regions.

9. The printed circuit board plug connectors according to claim 1, wherein said feathered sheet metal pieces of said frame are formed of individual parts being connected to said longitudinal walls and said transverse walls of said frame near said first printed circuit board, by spot welding.

10. The printed circuit board plug connector according to claim 1, wherein said longitudinal walls and said transverse walls of said frame have end surfaces facing said second contact bank, and individual, resilient guide lugs disposed on said end surfaces.

* * * * *